United States Patent [19]

Kobayashi

[11] 4,414,599
[45] Nov. 8, 1983

[54] ARRESTER AND A SEMICONDUCTOR CIRCUIT ARRANGEMENT WITH A PROTECTION DEVICE INCLUDING THE SAME

[75] Inventor: Sumio Kobayashi, Yokohama, Japan

[73] Assignee: Tokyo Shibaura Denki Kabushiki Kaisha, Kawasaki, Japan

[21] Appl. No.: 357,146

[22] Filed: Mar. 11, 1982

[30] Foreign Application Priority Data

Mar. 24, 1981 [JP]  Japan ................................. 56-41784

[51] Int. Cl.³ ...................... H02H 7/09; H02H 7/125
[52] U.S. Cl. ...................................... 361/56; 361/91; 363/54; 363/68
[58] Field of Search ............ 361/56, 91, 127; 307/252 L, 252 Q; 363/50, 52, 53, 54, 67, 68

[56] References Cited

U.S. PATENT DOCUMENTS

| | | | |
|---|---|---|---|
| 3,487,261 | 12/1969 | Boksjöet al. ...................... | 363/54 X |
| 3,532,901 | 10/1970 | Cavallius et al. .................. | 363/54 X |
| 3,599,075 | 8/1971 | Etter ................................. | 363/68 X |
| 3,947,726 | 3/1976 | DeCecco et al. .................. | 361/91 X |
| 4,282,568 | 8/1981 | Kobayashi et al. ................ | 363/54 |

FOREIGN PATENT DOCUMENTS 904797 2/1954  Fed. Rep. of Germany ........ 363/50

Primary Examiner—Harry E. Moose, Jr.
Attorney, Agent, or Firm—Finnegan, Henderson, Farabow, Garrett & Dunner

[57] ABSTRACT

An arrester is provided including series connected first and second nonlinear resistance elements and a by-pass circuit. The by-pass circuit is connected in parallel with the second nonlinear resistance element and short-circuits the second nonlinear resistance element only when a voltage of a predetermined polarity is applied to the second nonlinear resistance element. An semiconductor circuit arrangement with a protection device is also provided, where the arrester is used for protecting a semiconductor device.

14 Claims, 12 Drawing Figures

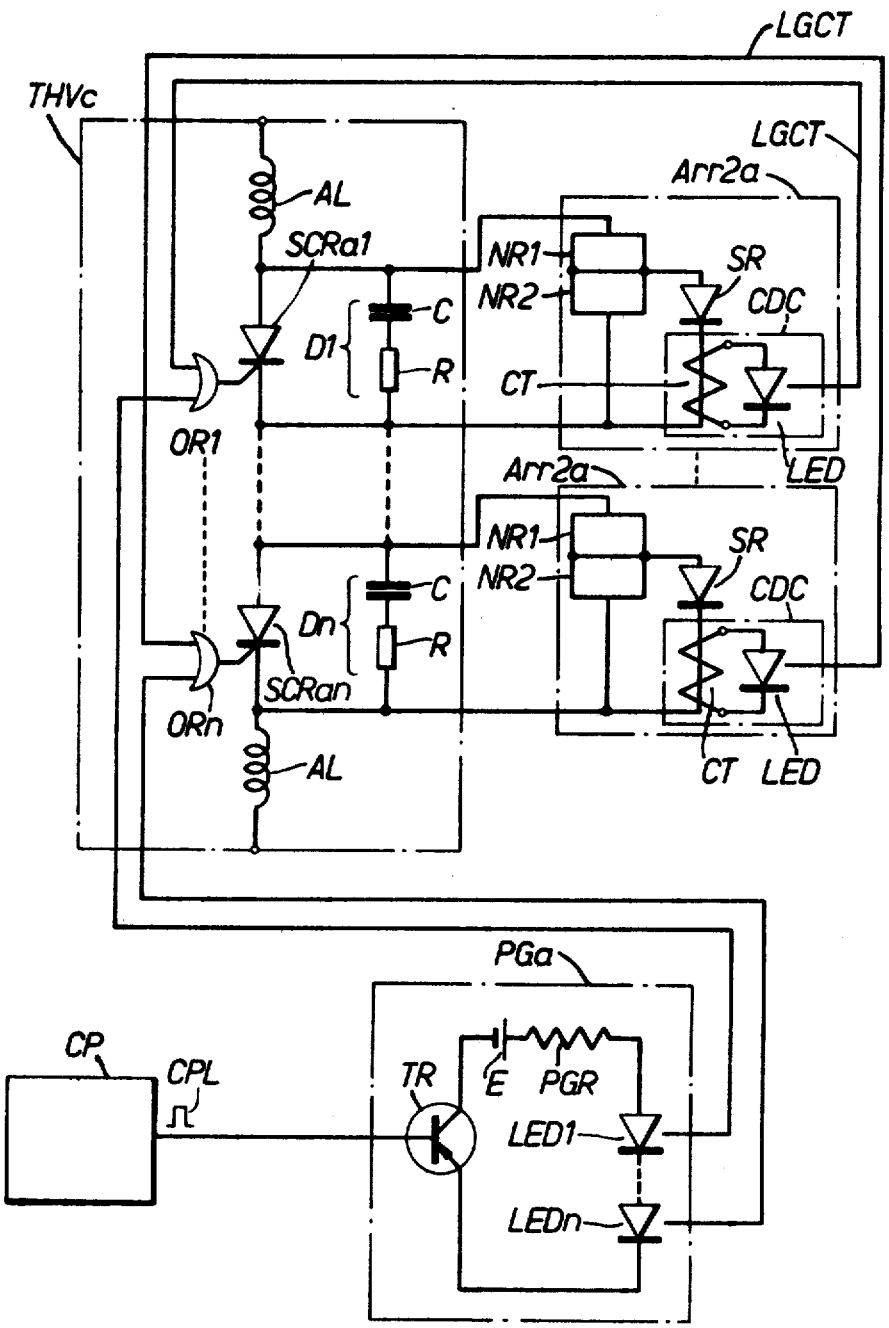
FIG. II.

ARRESTER AND A SEMICONDUCTOR CIRCUIT ARRANGEMENT WITH A PROTECTION DEVICE INCLUDING THE SAME

BACKGROUND OF THE INVENTION

1. Field of the Invention

This invention relates to an arrester and a semiconductor circuit arrangement with a protection device where the arrester is used for protecting the semiconductor device.

2. Description of the Prior Art

One example of a conventional semiconductor circuit arrangement will be explained first. Recently a high voltage semiconductor conversion device including semiconductor valves, such as thyristor valves, which consist of a plurality of thyristors connected in series, has been used in a DC transmission system. In such thyristor valves protection of thyristors is very important problem. Shown in FIG. 1 is an example of a conventional system for protecting a thyristor valve when an overvoltage is applied thereto. In FIG. 1, reference character THV designates a thyristor valve to be protected, which is composed of a series circuit of thyristors $SCR_1$ to $SCR_n$, voltage dividers $D_1$ to $D_n$, an anode reactor AL, a gate pulse generator (not shown) and the like. Each of the voltage dividers $D_1$ to $D_n$ includes a series connected circuit of a capacitor C and a resistor R. The thyristor valve THV is protected by an arrester Arr1 from an overvoltage. The arrester Arr1 is composed of a series connected gap G and nonlinear resistance element NR, in which an electrical discharge occurs at the gap G when a voltage appearing across the gap G exceeds a predetermined level, and any overvoltage energy is thus absorbed by the nonlinear resistance element NR so as to protect the thyristor valve THV.

In such a conventional device as shown in FIG. 1, a protection level against an overvoltage applied thereto is determined in accordance with the characteristics of the arrester Arr1. More specially, the protection level varies depending on various conditions such as the discharge condition at the gap G, the nonlinearity characteristic of the nonlinear resistance element NR and the like. According to the above factors, the number of thyristors $SCR_1$ to $SCR_n$ which are to be connected in series in the thyristor valve THV, is determined.

FIG. 2 indicates the v-t characteristic curve, wherein v is a spark-over voltage of the arrester, t is a period of time during which the firing voltage v is applied to the arrester and $V_p$ is a protection level. In FIG. 2 the spark-over characteristics at the gap G exhibit a tendency that the spark-over voltage v increases in response to a voltage abruptly applied to the gap G. On the other hand, withstand voltages of thyristor elements $SCR_1$ and $SCR_n$ decrease with respect to a forward voltage abruptly applied thereto as shown in FIG. 6, wherein v is a withstand voltage of a thyristor and t is a period of time during which the withstand voltage v is applied to the thyristor. Consequently, the protection level of the conventional arrester Arr1 is generally set at a protection level $V_p$ which is obtained taking the abruptly changing voltage into consideration as shown in FIG. 2.

That is, as is apparent from FIG. 2, the protection level of an arrester with a discharge gap becomes higher. Therefore, the conventional protection system in which such an arrester is employed to protect a thyristor valve is disadvantageous in that the necessary number of thyristors increases, with the result that it is not economical.

SUMMARY OF THE INVENTION

Accordingly, one object of this invention is to provide an arrester and a semiconductor circuit arrangement with a protection device including the arrester which can reduce the necessary number of semiconductor devices connected in series in the semiconductor circuit arrangement.

Another object of this invention is to provide an arrester and a semiconductor circuit arrangement with a protection device including the arrester which can be constructed as an economical and reliable semiconductor circuit arrangement.

These and other objects of this invention can be achieved by providing an arrester comprising series connected first and second nonlinear resistance elements and a unidirectional by-pass circuit. The unidirectional by-pass circuit is connected in parallel with the second nonlinear resistance element and short-circuits the second nonlinear resistance element only when a voltage of a predetermined polarity is applied to the second nonlinear resistance element.

According to this invention there is further provided a semiconductor circuit arrangement comprising a semiconductor valve including at least one semiconductor device, and a protection device. The protection device includes an arrester and is connected to the semiconductor valve to protect the semiconductor device. The arrester includes series connected first and second nonlinear resistance elements and a unidirectional by-pass circuit. The unidirectional by-pass circuit is connected in parallel with the second nonlinear resistance element and short-circuits the second nonlinear resistance element only when a voltage of a predetermined polarity is applied to the second nonlinear resistance element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 8, 9, 10, 11 and 12 are schematic diagrams showing another preferred embodiment of the present invention, respectively.

DETAILED DESCRIPTION OF THE PREFERRED EMBODIMENTS

Figure 1:
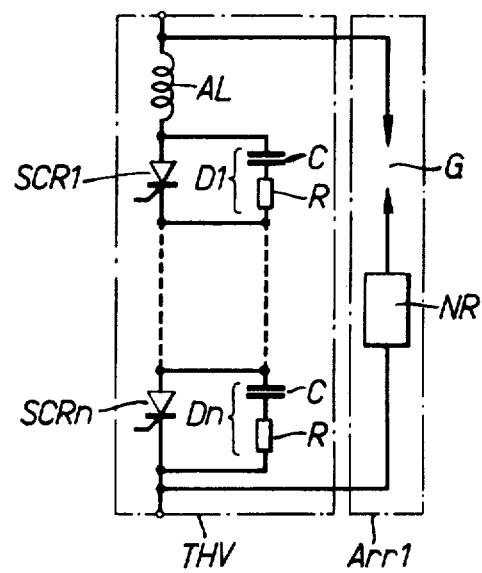
FIG. 1 is a schematic diagram showing a conventional overvoltage protection device for a thyristor valve.
Figure 2:
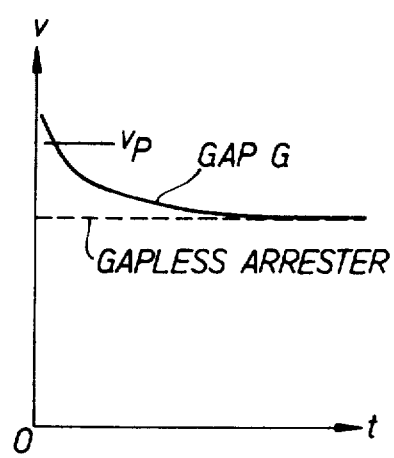
FIG. 2 is a graphical representation showing a v-t characteristic curve of an arrester.

As stated previously, in an arrester with a gap the spark-over characteristic tends to increase with the abruptness of the application of voltage. On the other hand, in an arrester without a gap the spark-over characteristic can be made flat as shown in FIG. 2. The protection level could be reduced by the use of a gapless arrester instead of the arrester Arr1 with the gap G in FIG. 1. In this case many problems have arisen as described below and therefore such a protection system has not been put into practical use.

Figure 3:
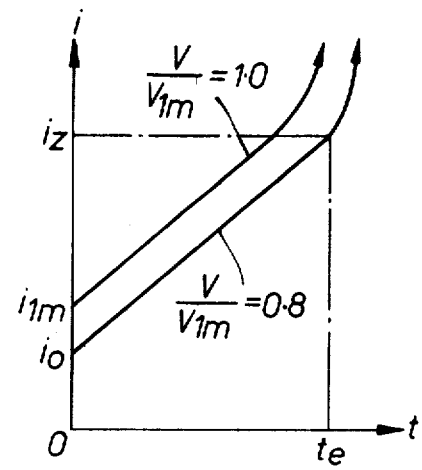
FIG. 3 is a graphical representation showing a life time characteristic of a nonlinear resistor element.

(1) In case of employing the gapless arrester, even when an ordinary voltage is applied to the thyristor valve, a leakage current flows through the nonlinear resistance element, resulting in deterioration of the resistance element in its characteristic. More concretely, the life time of the nonlinear resistance element is shortened. FIG. 3 is a graphical representation showing the relation between a period of time t during which a voltage is applied to the nonlinear resistance element and the leakage current i. In FIG. 3 an applied voltage ratio defined by a value which is obtained by dividing a voltage V applied to the nonlinear resistance element by a voltage $V_{lm}$ appearing across the nonlinear resistance element when a current of 1 mA flows therethrough, is regarded as a parameter. As is clear from FIG. 3, if the leakage current exceeds a certain current level iz, it abruptly increases. As a result, the nonlinear resistance element is likely to break down. On the other hand, as the applied voltage ratio increases, the life time is shortened. In FIG. 3 $i_o$ and $i_{lm}$ are leakage currents at t=0 when the coefficient $V/V_{lm}$ are 0.8 and 1.0, respectively. Accordingly, it is required to inhibit the leakage current from exceeding a desired current level $i_o$ taking an equipment's life time te into account.

Figure 4:
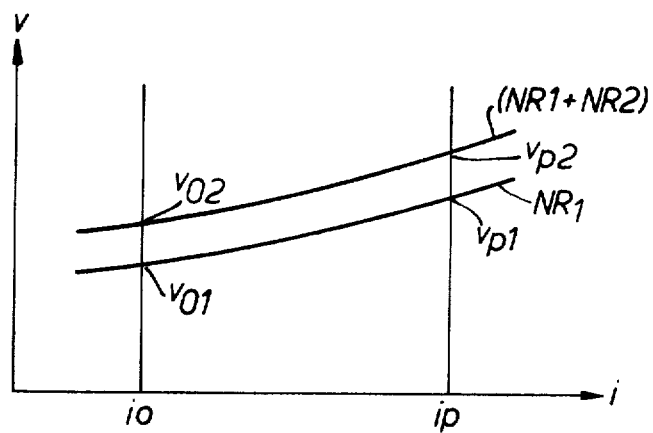
FIG. 4 is a graphical representation showing a v-i characteristic curve of the nonlinear resistor element.

(2) In order to suppress the leakage current flowing through the nonlinear resistance element, it is necessary to increase the resistance value of the nonlinear resistance element. As a result, the protection level of the arrester, when an overvoltage is applied, also increases. FIG. 4 is a graphical representation showing the v-i characteristic curve of the nonlinear resistance element where the resistance value thereof is regarded as a parameter. Assuming that reference character $i_o$ indicates a maximum allowable leakage current value and reference character $i_p$ indicates a current value when an applied voltage exceeds an allowable voltage range, a continuous allowable applied voltage and a protection level of a nonlinear resistance element $NR_1$ are represented by reference characters $v_{o1}$ and $v_{p1}$, respectively. On the contrary, a continuous allowable applied voltage and a protection level of series connected nonlinear resistance elements $NR_1+NR_2$ are represented by reference characters $v_{o2}$ and $v_{p2}$, respectively. They are higher than those of the resistance element $NR_1$.

In attempting to find a solution of the two problems described above, it was found that the differences in the withstand voltages of a thyristor in the forward and reverse directions presented a great difficulty. This difficulty will be explained hereinafter with reference to FIGS. 5 and 6. Taking the differences in the withstand voltages of a thyristor into consideration, the present invention has been able to solve the problems in leakage current described previously. Under the invention the number of thyristors connected in series in a thyristor valve is reduced while maintaining appropriate protection level.

Figure 7:
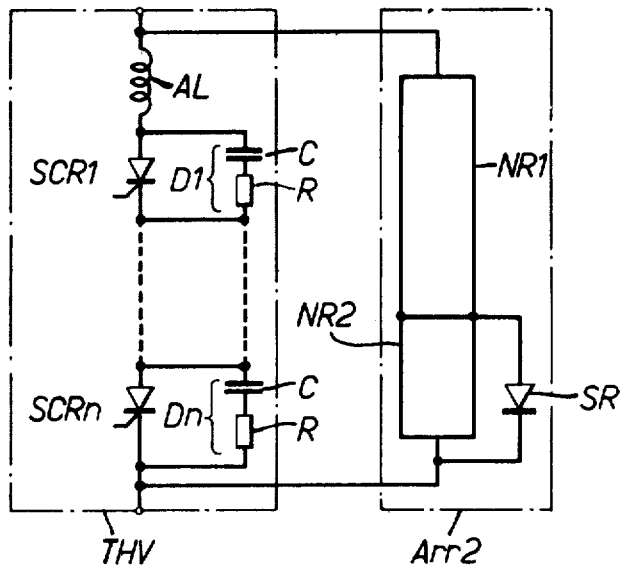
FIG. 7 is a schematic diagram showing one preferred embodiment of the present invention.

Referring now to the drawings, wherein like reference numerals and characters designate identical or corresponding parts throughout the several views, and more particularly to FIG. 7 thereof wherein one preferred embodiment of this invention is shown, a gapless arrester Arr2 includes a series connected nonlinear resistance elements $NR_1$ and $NR_2$, and a by-pass circuit SR composed of series connected diodes which is connected in parallel with the nonlinear resistance element $NR_2$. The arrester Arr2 is used as a protection device for the thyristor valve THV.

Nonlinear resistance elements $NR_1$ and $NR_2$ are formed, for example, of a sintered material including zinc oxide as a major component. In the gapless arrester Arr2 the by-pass circuit SR is provided to operate as short-circuit the of the nonlinear resistance element $NR_2$ when an overvoltage in a forward direction is applied to the thyristor valve THV, whereby a protection level in the forward direction is selectively reduced. In such the gapless arrester Arr2 thus constituted, while a leakage current i with respect to an ordinary applied voltage is inhibited from exceeding an allowable current range $i_o$, the protection level with respect to the overvoltage in the forward direction is represented by the $v_{p1}$ shown in FIG. 4, whereas the protection level with respect to that in the reverse direction is represented by $v_{p2}$ shown in FIG. 4. Therefore, it is possible to obtain the gapless arrester Arr2 whose protection levels are different in the forward and reverse directions; that is, the gapless arrester Arr2 in which the protection level in the forward direction is lower than that in the reverse direction. As described above, since the withstand voltage of the thyristor in the forward direction is lower than that in the reverse direction, when the gapless arrester Arr2 is used to protect the thyristors $SCR_1$ to $SCR_n$, the necessary number of thyristors $SCR_1$ to $SCR_n$ which are contained in the thyristor valve THV, can be reduced.

Figure 5:
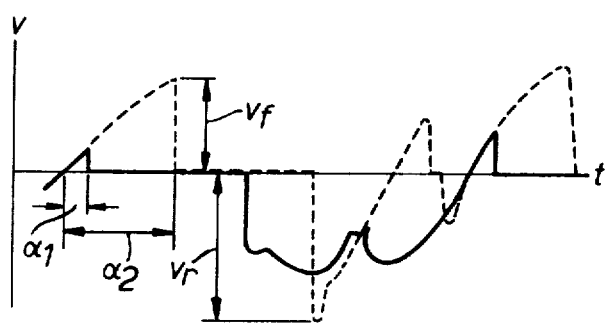
FIG. 5 is a graphical representation showing the voltage waveform of the thyristor valve.

Namely, in the case where the thyristor valve THV is driven as a three-phase bridge circuit (not shown), the waveform of a voltage which is usually applied to the thyristor valve THV, varies in accordance with a controlling angle α of the thyristors and is asymmetrical in the forward and reverse directions as shown in FIG. 5. In FIG. 5 two waveforms corresponding to two controlling angles $α_1$ and $α_2$ are shown. In case of the controlling angle α being approximately $α_2 (=90°)$, as indicated by a dotted line in FIG. 5, the voltages in the forward and reverse directions exhibit maximum values, respectively. Therefore a value of the leakage current i flowing through the gapless arrester Arr2 which is connected in parallel to the thyristor valve THV, has to be determined taking the above fact into consideration. In this case, the maximum voltage value in the forward direction is equal to a value $v_f$ of an AC voltage applied to the thyristor valve. The maximum voltage $v_r$ in the reverse direction increases to a value 1.3 to 1.35 times as much as the maximum value $v_f$ due to a transient overshoot (referred to as a commutation overshoot) which occurs when the thyristor is turned off.

Figure 6:
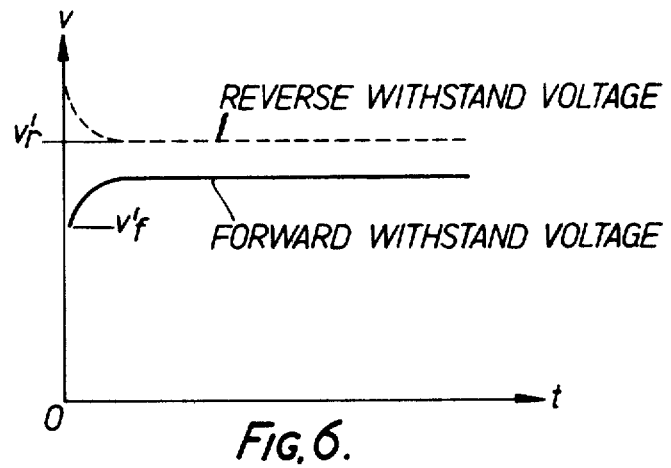
FIG. 6 is a graphical representation showing a withstand voltage characteristic in forward and reverse directions for a thyristor element.

Under an assumption that a gapless arrester without a by-pass circuit which is different in type from that of the invention is employed to protect the thyristor valve, the necessary number of thyristors to be connected in series in the thyristor valve can be expressed as follows. In the case where an maximum allowable value of the leakage current flowing through the arrester with the maximum voltage $v_r$ across the thyristor valve, is determined at the current value $i_o$ shown in FIG. 4, the maximum voltage $v_r$ is equal to the continuous allowable applied voltage $V_{o2}$, and the protection level of the arrester, when the excess current $i_p$ flows, is thus equal to the protection level $v_{p2}$. Since the overvoltage has polarities in both forward and reverse directions, and further the withstand voltage of the thyristor in the forward direction is lower than that in the reverse direction as shown in FIG. 6, the necessary number n of thyristors connected in series should be obtained based on the voltage $v_f'$ in the forward direction. Accordingly, the necessary number n of series connected thyristors is expressed as follows:

$$n = \frac{v_{p2} \times k}{v_f'} \quad (1)$$

where $v_f'$ is the withstand voltage of a thyristor in a forward direction shown in FIG. 6 and k is a voltage unbalance factor among series connected thyristors.

In contrast, in the embodiment according to this invention shown in FIG. 7, the gapless arrester Arr2 with the by-pass circuit SR is used for protecting thyristors $SCR_1$ to $SCR_n$ in the thyristor valve THV. Generally the ratio $v_r/v_f$ of voltage in the reverse and forward directions, which are usually applied to the thyristor valve, is equal to between 1.3 and 1.35. Thus, in order to adjust the leakage current with the voltage $v_f$ in the forward direction to the allowable current value $i_o$ of the arrester Arr2, it is considered that the voltage $v_f$ in the forward direction is set to the continuous allowable applied voltage $v_{o1}$, whereas the voltage $v_r$ in the reverse direction is set to the voltage $v_{o2}$. In this case, a protection level in the forward direction is defined by $v_{p1}$ whereas that in the reverse direction is defined by $v_{p2}$. Therefore, $v_{p2}/v_{p1} \simeq 1.3$ to 1.35. Accordingly, the necessary number of thyristors is determined so as to meet the protection level $v_{p1}$ in the forward direction and that $v_{p2}$ in the reverse direction.

The necessary number $n_f$ of the thyristors, which is obtained with respect to the protection level $v_{p1}$ in the forward direction, is expresed as follows:

$$n_f = \frac{v_{p1} \times k}{v_f'}$$

The necessary number $n_r$ of the thyristors, which is obtained with respect to the protection level $v_{p2}$ in the reverse direction, is expressed as follows:

$$n_r = \frac{v_{p2} \times k}{v_r'}$$

where $v_r'$ is a withstand voltage of the thyristor in the reverse direction. It is ideal to design a thyristor valve so as to meet the condition of $n_f = n_r$. In this case, the following expression (2) is obtained:

$$n_f = n_r = \frac{v_{p1} \times k}{v_f'} = \frac{v_{p2} \times k}{v_r'} \quad (2)$$

From the expression (2), $$\frac{v_{p2}}{v_{p1}} \simeq \frac{v_r'}{v_f'} \simeq 1.3 \text{ to } 1.35 \quad (3)$$

That is, it is an optimum condition that the ratio of the withstand voltage in the reverse direction and that in the forward direction is adjusted within the range of 1.3 to 1.35. In this case, the necessary number of the thyristors can be remarkably reduced to 1/1.3 to 1/1.35 when compared with the number of the thyristors defined by the expression (1).

As the protection level is approximately proportional to the resistance value of the nonlinear resistance element, it is an optimum condition that the ratio of the resistance value of the nonlinear resistance element $(NR_1 + NR_2)$ and that of the nonlinear resistance element $NR_1$ is within the range of 1.3 to 1.35.

$$\left( \frac{NR_1 + NR_2}{NR_1} \simeq 1.3 \sim 1.35 \right)$$

Figure 8:
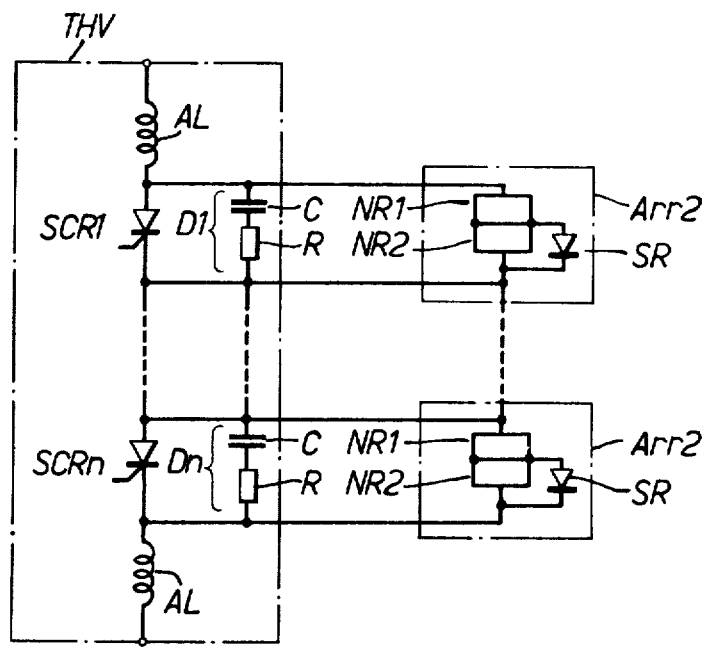

The present invention has been described hereinbefore with reference to an embodiment in which an arrester is connected in parallel across a thyristor valve including series connected thyristors. It goes without saying that the same effects can be obtained by providing a plurality of gapless arresters Arr2 according to this invention, each arrester Arr2 being connected in parallel with the corresponding one thyristor $SCR_1 \sim SCR_n$, as shown in FIG. 8.

Figure 9:
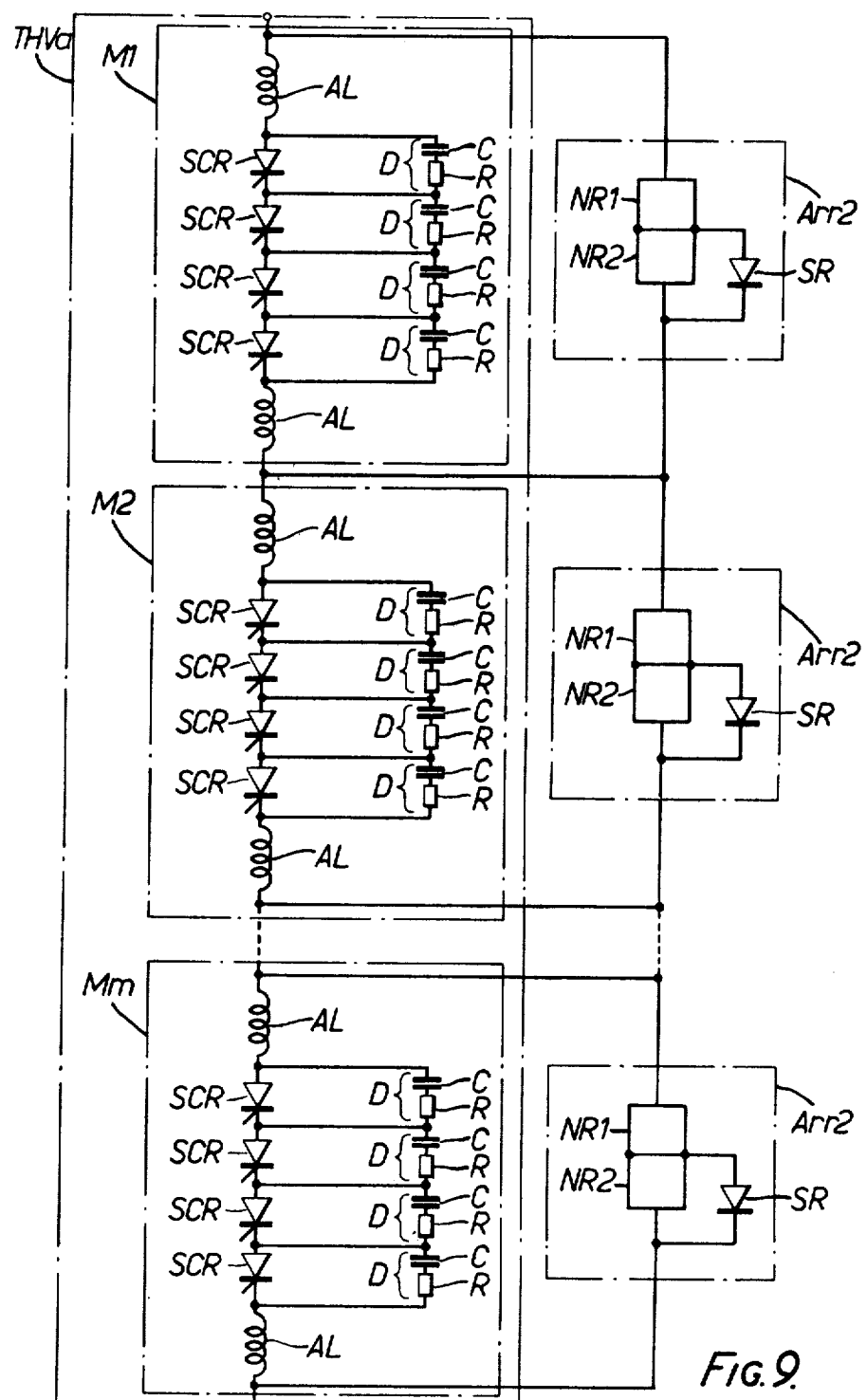

Further when a thyristor valve THVa includes a plurality of series connected modules $M_l \sim M_m$, each module $M_l \sim M_m$ having series connected thyristors SCR and reactors AL, and voltage dividers D, the same effects can be obtained by providing a plurality of arresters Arr2 according to this invention, each arrester Arr2 being connected in parallel with the corresponding one module, $M_l \sim M_m$, as shown in FIG. 9.

Figure 10:
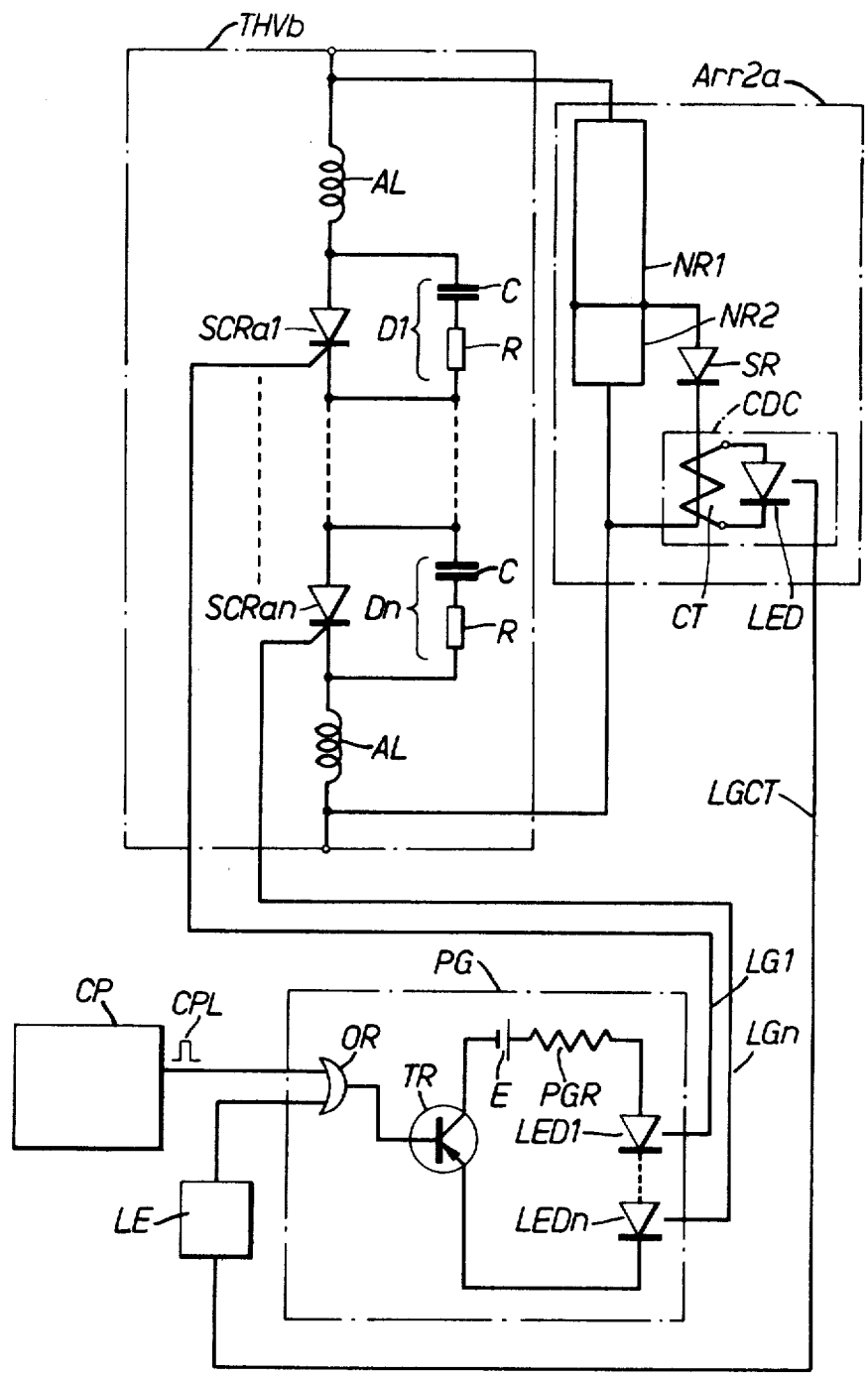

FIG. 10 shows another embodiment of this invention. In FIG. 10, reference character Arr2a designates an arrester according to another embodiment of this invention, which includes the series connected nonlinear resistance elements $NR_1$ and $NR_2$ and the by-pass circuit SR connected in parallel with the nonlinear resistance element $NR_2$. The arrester Arr2a further includes a current detection circuit CDC connected in series with the by-pass circuit SR. The current detection circuit CDC includes a current transformer CT which detects a current flowing through the by-pass circuit SR and a light emitting diode LED. The light emitting diode LED is connected in series with the current transformer CT and produces a light signal based on the detected current flowing through the light emitting diode LED.

Reference character THVb designates a thyristor valve to be protected by the arrester Arr2a, which is composed of a series circuit of photo thyristors $SCR_{a l}$ to $SCR_{an}$, the voltage deviders $D_1$ to $D_n$, the anode reactors AL. Reference character CP designates a control panel and produces a timing pulse CPL which is applied to a gate pulse generator PG. The timing pulse CPL is then applied to a transistor TR through an OR gate OR to be amplified. As a result of this, a current flows through a resistor PGR, light emitting diodes $LED_l$ to $LED_n$ and the transistor TR from a power source E. The light signals produced by the light emitting diodes LED$_l$ to LED$_n$ are stransmitted to the gate terminals of the photo thyristors SCR$_l$ to SCR$_n$ through optical fibers LG$_l$ to LG$_n$, respectively. The light signal of the light emitting diode LED in the current detection circuit CDC is applied to a light-electricity converter LE through an optical fiber LGCT. The applied light signal is converted into an electric signal in the light-electricity converter LE and then applied to the transistor TR through the OR gate OR. As a result of this, the light signals are also produced at the light emitting diodes LED$_l$ to LED$_n$ and are transmitted to the gate terminals of the photo thyristors SCR$_l$ to SCR$_n$ to thereby trigger all the photo thyristors SCR$_l$ to SCR$_n$ simultaneously.

In this embodiment, when it is necessary to reduce the protection level in the forward direction sharply, it may be possible to detect the current flowing through the by-pass circuit SR, drive the gate pulse generator PG for the thyristor valve THVb in response to the thus detected current and then forcibly trigger all of the photo thyristors SCR$_{al}$ to SCR$_{an}$ connected in series simultaneously, to thereby prevent break-down and component damage.

In a critical turn off condition, it sometimes occurs that some of the series connected thyristors in the thyristor valve are turned off and others remain to be ON state. In this case an overvoltage may be applied to the turned off thyristors in the forward direction and they may be destroyed. In order to avoid this, still another embodiment of this invention, shown in FIG. 11, is provided. In FIG. 11, reference character THVc designates a thyristor valve which has the same construction as the thyristor valve THVb shown in FIG. 10 except that there are further provided OR gates OR$_l$ to OR$_n$ for the photo thyristors SCR$_{al}$ to SCR$_{an}$, respectively. A gate pulse generator PGa is provided instead of the gate pulse generator PG shown in FIG. 10. The gate pulse generator PGa has the same construction as the gate pulse generator PG except that the OR gate OR is omitted. And the light signal from the arrester Arr2a is not applied to the gate pulse generator PGa. The gate pulse generator PGa receives the timing pulse CPL from the control panel CP and produces light signals at the light emitting diodes LED$_l$ to LED$_n$. Each of the arresters Arr2a is connected in parallel with each of the photo thyristors SCR$_{al}$ to SCR$_{an}$. Each of the light signals of the light emitting diodes LED of the arresters Arr2a is applied to each of one input terminals of the OR gates OR$_l$ to OR$_n$. Each of the light signals of the light emitting diodes LED$_l$ to LED$_n$ of the gate pulse generator PGa is applied to each of the other input terminals of the OR gates OR$_l$ to OR$_n$. Each of the output terminals of the OR gates OR$_l$ to OR$_n$ is connected to each of the gate terminals of the photo thyristors SCR$_{al}$ to SCR$_{an}$. Each of the photo thyristors SCR$_{al}$ to SCR$_{an}$ can be triggered by the light signals from each of the light emitting diodes LED$_n$ to LED$_n$ or the light signal from the light emitting diode LED of the corresponding arrester Arr2a.

When an overvoltage in the forward direction is applied to the turned off photo thyristors SCR$_{al}$ to SCR$_{an}$, the current flowing through the by-pass circuit SR of the corresponding gapless arrester Arr2a is detected and the detected current is used to trigger the corresponding turned off photo thyristors SCR$_{al}$ to SCR$_{an}$, to thereby protect the photo thyristors SCR$_{al}$ to SCR$_{an}$ from an overvoltage in the forward direction.

Figure 12:
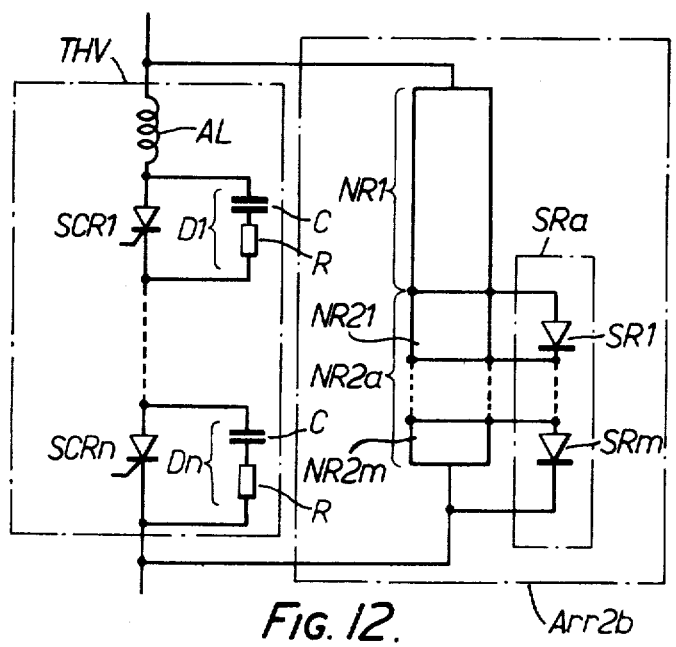

FIG. 12 shows an arrester Arr2b according to another embodiment of this invention. The arrester Arr2b includes a series connected nonlinear resistance elements NR$_1$ and NR$_{2a}$ and a by-pass circuit SRa connected in parallel with the nonlinear resistance elements NR$_{2a}$. The by-pass circuit SRa includes a plurality of series connected diodes SR$_l$ to SR$_m$ and the nonlinear resistance element NR$_{2a}$ is devided into a plurality of series connected nonlinear resistance element portions NR$_{21}$ to NR$_{2m}$. Each of the diodes SR$_l$ to SR$_m$ is connected in parallel with the corresponding one nonlinear resistance element portion NR$_{2l}$ to NR$_{2m}$. In this embodiment, nonlinear resistance portions NR$_{2l}$ to NR$_{2m}$ necessary to be by-passed may serve as voltage dividing elements of the series connected diodes SR$_l$ to SR$_m$.

In above described embodiments of this invention, a thyristor or a photo thyristor and a thyristor valve are employed as a semiconductor device and a semiconductor valve, respectively. But this invention is not limited to these embodiments. For example, a gate turn-off thyristor may be used as a semiconductor device.

As described above, by employing a gapless arrester according to this invention as an overvoltage protection device for a semiconductor circuit arrangement, the required number of semiconductor devices connected in series in the semiconductor valves can be remarkably reduced. As a result of which the provision of an economical and reliable semiconductor circuit arrangement becomes possible.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An arrester comprising:
    first nonlinear resistance means;
    second nonlinear resistance means connected in series with said first nonlinear resistance means; and
    by-pass circuit means connected in parallel with said second nonlinear resistance means for short-circuiting said second nonlinear resistance means only when a voltage of a predetermined polarity is applied to said second nonlinear resistance means.
2. The arrester according to claim 1, wherein:
    said first and second nonlinear resistance means include zinc oxide.
3. The arrester according to claim 1, wherein:
    said by-pass circuit means includes a diode.
4. The arrester according to claim 1, wherein:
    said by-pass circuit means includes a series circuit of a plurality of diodes;
    said second nonlinear resistance means includes a series connection of a like plurality of nonlinear resistance element portions;
    each of said diodes is connected in parallel with each said corresponding nonlinear resistance element portion.
5. The arrester according to claim 1, wherein:
    the resistance value of said second nonlinear resistance means is used 35 percent with respect to the resistance value of said first nonlinear resistance means.
6. The arrester according to claim 1, further comprising:

current detection means connected to detect a current flowing through said by-pass circuit means for producing a signal based on said detected current.

7. The arrester according to claim 6, wherein:
said current detection means includes a current transformer connected to detect the current flowing through said by-pass circuit means, and a light emitting diode connected to said current transformer for producing a light signal as said signal based on said detected current.

8. A semiconductor circuit arrangement, comprising:
a semiconductor valve including at least one semiconductor device; and
protection means connected to said semiconductor valve for protecting said semiconductor device; said protection means including an arrester,
said arrester including series connected first and second nonlinear resistance means, and by-pass circuit means connected in parallel with said second nonlinear resistance means for short-circuiting said second nonlinear resistance means only when a voltage of a predetermined polarity is applied to said second nonlinear resistance means.

9. The semiconductor circuit arrangement according to claim 8, wherein:
said semiconductor valve includes a series circuit of a plurality of said semiconductor devices and a reactor;
said protection means includes a series circuit of a like plurality of said arrester; and
each of said arresters is connected in parallel with each said corresponding semiconductor device.

10. The semiconductor circuit arrangement according to claim 8, wherein:
said semiconductor valve includes a series circuit of a plurality of modules, each module including said semiconductor device;
said protection means includes a series circuit of a like plurality of said arresters; and
each of said arresters is connected in parallel with each said corresponding module.

11. The semiconductor circuit arrangement according to claim 8, further comprising gate pulse generator means for controlling said semiconductor device to turn on or turn off, wherein:
said arrester further includes current detection means connected to detect a current flowing through said by-pass circuit means for producing a signal based on said detected current; and
said gate pulse generator means is further connected to said arrester for receiving said signal and for protecting said semiconductor device based on said signal.

12. The semiconductor circuit arrangement according to claim 8, further comprising gate pulse generator means for controlling said semiconductor device to turn on or turn off, wherein:
said semiconductor valve includes a series circuit of a plurality of said semiconductor devices and a reactor;
said protection means includes a series circuit of a like plurality of said arresters, each of said arresters being connected in parallel with each said corresponding semiconductor device;
each of said arrester further includes current detection means connected to detect a current flowing through said by-pass circuit means for producing a signal based on said detected current; and
each of said semiconductor devices is further connected to each said corresponding current detection means for receiving said signal to be protected by said signal.

13. The semiconductor circuit arrangement according to claim 8, 9, 10, 11 or 12, wherein:
said semiconductor valve is a thyristor valve; and
said semiconductor device is a thyristor.

14. The semiconductor circuit arrangement according to claim 11 or 12, wherein:
said semiconductor valve is a thyristor valve; and
said semiconductor device is a photo thyristor.

* * * * *